United States Patent
Lee et al.

(10) Patent No.: US 10,713,779 B2
(45) Date of Patent: Jul. 14, 2020

(54) METHOD OF INSPECTING DISPLAY PANEL

(71) Applicant: Samsung Display Co., Ltd., Yongin-si, Gyeonggi-do (KR)

(72) Inventors: Seongmin Lee, Asan-si (KR); Dongjin Lee, Seoul (KR); Jukyung Jo, Asan-si (KR); Suna Yang, Suwon-si (KR); Hyuksang Jun, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 91 days.

(21) Appl. No.: 16/034,149

(22) Filed: Jul. 12, 2018

(65) Prior Publication Data

US 2019/0114757 A1    Apr. 18, 2019

(30) Foreign Application Priority Data

Oct. 13, 2017   (KR) .......................... 10-2017-0132923

(51) Int. Cl.
*G06T 7/00* (2017.01)
*G06T 7/60* (2017.01)
(Continued)

(52) U.S. Cl.
CPC ............ *G06T 7/001* (2013.01); *G06T 7/60* (2013.01); *G06T 7/90* (2017.01); *H01L 51/0031* (2013.01);
(Continued)

(58) Field of Classification Search
CPC .. G06T 7/001; G06T 7/90; G06T 7/60; G06T 2207/30108; G06T 7/0004;
(Continued)

(56) References Cited

U.S. PATENT DOCUMENTS

| | | | |
|---|---|---|---|
| 6,606,116 B1 * | 8/2003 | Poynter | G09G 3/006 345/173 |
| 7,110,104 B2 | 9/2006 | Choi et al. | |
| 7,860,296 B2 | 12/2010 | Kwon et al. | |
| 8,818,073 B2 | 8/2014 | Lee et al. | |
| 8,922,600 B2 * | 12/2014 | Moon | G09G 5/10 345/690 |

(Continued)

FOREIGN PATENT DOCUMENTS

| | | |
|---|---|---|
| JP | 2000-81368 A | 3/2000 |
| JP | 2009-168466 A | 7/2009 |

(Continued)

OTHER PUBLICATIONS

Notice of Allowance issued in U.S. Appl. No. 13/676,607 by the USPTO (now U.S. Pat. No. 8,922,600), dated Aug. 19, 2014, 9 pages.

*Primary Examiner* — Brandon J Miller
(74) *Attorney, Agent, or Firm* — Lewis Roca Rothgerber Christie LLP

(57) ABSTRACT

A method of inspecting a display panel, which is capable of substantially minimizing a color difference of a display panel according to a viewing angle, includes: setting a reference area having a center point on a chromaticity diagram; emitting a white light on the display panel; measuring first color coordinates of a target point of the display panel at a first viewing angle; measuring second color coordinates of the target point at a second viewing angle; calculating a difference value between the first color coordinates and the second color coordinates; converting the difference value into target polar coordinates with the center point as an origin; and determining whether the target polar coordinates are within the reference area.

18 Claims, 9 Drawing Sheets

(51) Int. Cl.
*H01L 51/00* (2006.01)
*H01L 51/56* (2006.01)
*G06T 7/90* (2017.01)
*H01L 51/52* (2006.01)
*H01L 51/50* (2006.01)

(52) U.S. Cl.
CPC .... *H01L 51/56* (2013.01); *G06T 2207/30108* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5221* (2013.01); *H01L 51/5265* (2013.01); *H01L 2251/558* (2013.01)

(58) Field of Classification Search
CPC . G06T 2207/30121; G06T 2207/10024; H01L 51/56; H01L 51/5206; H01L 51/0031; H01L 51/52; H01L 51/005; H01L 51/5265; H01L 51/5056; H01L 51/5072; H01L 51/5092; H01L 51/5221
See application file for complete search history.

(56) References Cited

U.S. PATENT DOCUMENTS

| | | | |
|---|---|---|---|
| 9,356,083 | B2 | 5/2016 | Kang et al. |
| 2003/0142314 | A1 | 7/2003 | Hubble, III et al. |
| 2005/0072908 | A1 | 4/2005 | Grunert et al. |
| 2007/0035536 | A1* | 2/2007 | Alessi ............. G09G 3/20 345/207 |
| 2008/0253445 | A1 | 10/2008 | Hekstra et al. |
| 2009/0179881 | A1 | 7/2009 | Hibi |
| 2010/0259555 | A1 | 10/2010 | Hibi et al. |
| 2012/0026315 | A1 | 2/2012 | Lee et al. |
| 2017/0116956 | A1* | 4/2017 | Yang ............... G09G 5/10 |

FOREIGN PATENT DOCUMENTS

| | | |
|---|---|---|
| JP | 2010-249548 A | 11/2010 |
| JP | 2010-281049 A | 12/2010 |
| KR | 10-2009-0020790 A | 2/2009 |
| KR | 10-2012-0011546 A | 2/2012 |
| KR | 10-2014-0007583 A | 1/2014 |
| KR | 10-2014-0088408 A | 7/2014 |
| KR | 10-2017-0048984 A | 5/2017 |

\* cited by examiner

METHOD OF INSPECTING DISPLAY PANEL

CROSS-REFERENCE TO RELATED APPLICATION

This application claims priority to and the benefit of Korean Patent Application No. 10-2017-0132923, filed on Oct. 13, 2017 in the Korean Intellectual Property Office, the entire disclosure of which is incorporated by reference herein.

FIELD

Aspects of embodiments of the present invention relate to a method of inspecting a display panel.

DISCUSSION OF THE RELATED ART

Organic light emitting diode ("OLED") display devices are self-light emitting display devices that display images using an OLED which emits light. OLED display devices are currently garnering attention by virtue of their characteristics such as low power consumption, high luminance, high reaction speed, and the like.

Display panels of OLED display devices may have luminous difference depending on an angle (a viewing angle) at which a viewer views a screen, or brightness difference between R, G, and B pixels. For example, a screen that appears white when viewed from the front side may look reddish, bluish, yellowish, or greenish at a viewing angle of about 60 degrees with respect to the front side.

Such a viewing angle problem lowers display quality of the display panel and may cause inconvenience to users. Accordingly, studies are being conducted to substantially minimize a color difference of the display panel depending on the viewing angle.

It is to be understood that this background of the technology section is intended to provide useful background for understanding the technology and as disclosed herein, this technology background section may include ideas, concepts, or recognitions that were not part of what was known or appreciated by those skilled in the pertinent art prior to a corresponding effective filing date of subject matter disclosed herein.

SUMMARY

According to an aspect of embodiments of the present invention, a method of inspecting a display panel reduces or substantially minimizes a color difference of a display panel according to a viewing angle.

According to one or more exemplary embodiments, a method of inspecting a display panel includes: setting a reference area having a center point on a chromaticity diagram; emitting a white light on the display panel; measuring first color coordinates of a target point of the display panel at a first viewing angle; measuring second color coordinates of the target point at a second viewing angle; calculating a difference value between the first color coordinates and the second color coordinates; converting the difference value into target polar coordinates with the center point as an origin; and determining whether the target polar coordinates are within the reference area.

Setting of the reference area may include: setting reference color coordinates of a reference line defining the reference area; and converting the reference color coordinates into reference polar coordinates with the center point as an origin.

Determining whether the target polar coordinates are within the reference area may include: comparing an angle of the target polar coordinates with an angle of the reference polar coordinates; and comparing sizes between a first distance from the center point to the reference polar coordinates and a second distance from the center point to the target polar coordinates when the angle of the target polar coordinates is equal to the angle of the reference polar coordinates.

It may be determined that the target polar coordinates are within the reference area when the first distance is greater than or equal to the second distance.

It may be determined that the target polar coordinates are outside the reference area when the first distance is less than the second distance.

The display panel may include: a first electrode on a substrate; a plurality of organic layers on the first electrode; and a second electrode on the plurality of organic layers.

The method may further include adjusting a thickness of at least one of the plurality of organic layers when the first distance is less than the second distance.

A total thickness of the plurality of organic layers may be adjusted in a range from about 1 Å to about 100 Å.

The plurality of organic layers may include at least one of a red organic light emitting layer, a green organic light emitting layer, and a blue organic light emitting layer.

The plurality of organic layers may further include at least one of a hole injection layer, a hole transport layer, an electron injection layer, an electron transport layer, a light emission auxiliary layer, and a resonance auxiliary layer.

Determining whether the target polar coordinates are within the reference area may include: comparing an angle of the target polar coordinates with an angle of the reference polar coordinates; and calculating a ratio between a first distance from the center point to the reference polar coordinates and a second distance from the center point to the target polar coordinates when the angle of the target polar coordinates is equal to the angle of the reference polar coordinates.

It may be determined that the target polar coordinates are within the reference area when a ratio of the second distance to the first distance is equal to or less than 1.

It may be determined that the target polar coordinates are outside the reference area when the ratio of the second distance to the first distance is greater than 1.

The display panel may include: a first electrode on a substrate; a plurality of organic layers on the first electrode; and a second electrode on the plurality of organic layers.

The method may further include adjusting a thickness of at least one of the plurality of organic layers when the ratio of the second distance to the first distance is greater than 1.

A total thickness of the plurality of organic layers may be adjusted in a range from about 1 Å to about 100 Å.

The plurality of organic layers may include at least one of a red organic light emitting layer, a green organic light emitting layer, and a blue organic light emitting layer.

The reference line may be a closed curve having a circular shape or an irregular shape.

The first viewing angle may be a front viewing angle of the display panel.

When the front viewing angle of the display panel is about 0 degrees, the second viewing angle may be in a range from about 15 degrees to about 60 degrees.

The foregoing is illustrative and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

A more complete appreciation of the present invention will become more apparent by describing in further detail some exemplary embodiments thereof with reference to the accompanying drawings, wherein.

DETAILED DESCRIPTION

Figure 1:
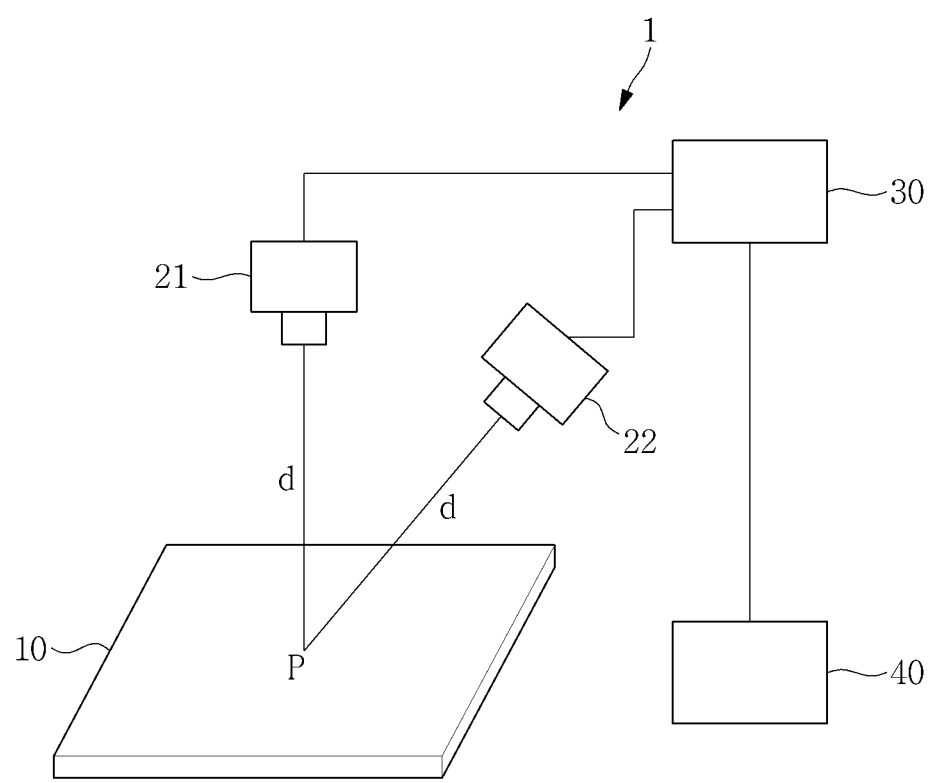
FIG. 1 is a block diagram illustrating an inspection device for a display panel according to an exemplary embodiment.

Some exemplary embodiments will now be described more fully herein with reference to the accompanying drawings. Although the invention may be modified in various manners and may have additional exemplary embodiments, some exemplary embodiments are illustrated in the accompanying drawings and will be mainly described in the specification. However, the scope of the invention is not limited to the described exemplary embodiments and should be construed as including all changes, equivalents, and substitutions included within the spirit and scope of the invention.

In the drawings, thicknesses of a plurality of layers and areas may be illustrated in an enlarged manner for clarity and ease of description thereof. When a layer, area, or plate is referred to as being "on" another layer, area, or plate, it may be directly on the other layer, area, or plate, or one or more intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or one or more intervening layers, areas, or plates may be present therebetween. Conversely, when a layer, area, or plate is referred to as being "directly below" another layer, area, or plate, intervening layers, areas, or plates may be absent therebetween.

Spatially relative terms, such as "below," "beneath," "lower," "above," "upper," and the like, may be used herein for ease of description to describe relations between one element or component and another element or component as illustrated in the drawings. It is to be understood that the spatially relative terms are intended to encompass different orientations of the device in use or operation, in addition to the orientation depicted in the drawings. For example, in a case in which a device illustrated in the drawing is turned over, the device positioned "below" or "beneath" another device may be placed "above" another device. Accordingly, the illustrative term "below" may include both the lower and upper positions. The device may also be oriented in another direction and, thus, the spatially relative terms may be interpreted differently depending on the orientations.

Throughout the specification, when an element is referred to as being "connected" to another element, the element may be connected to the other element, or electrically connected to the other element with one or more intervening elements interposed therebetween. It is to be further understood that the terms "comprises," "including," "includes," and/or "including," when used in this specification, specify the presence of stated features, integers, steps, operations, elements, and/or components, but do not preclude the presence or addition of one or more other features, integers, steps, operations, elements, components, and/or groups thereof.

It is to be understood that, although the terms "first," "second," "third," and the like may be used herein to describe various elements, these elements should not be limited by these terms. These terms are used to distinguish one element from another element. Thus, a "first" element discussed below could be termed a "second" element or a "third" element, and a "second" element and a "third" element may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations, or within ±30%, 20%, 10%, or 5% of the stated value.

Unless otherwise defined, all terms used herein (including technical and scientific terms) have the same meaning as commonly understood by those skilled in the art to which this invention pertains. It is to be further understood that terms, such as those defined in commonly used dictionaries, should be interpreted as having a meaning that is consistent with their meaning in the context of the relevant art and are not to be interpreted in an idealized or excessively formal sense unless clearly defined in the present specification.

Some of the parts which are not associated with the description may not be provided in order to specifically describe embodiments of the present invention, and like reference numerals refer to like elements throughout the specification.

Figure 2:
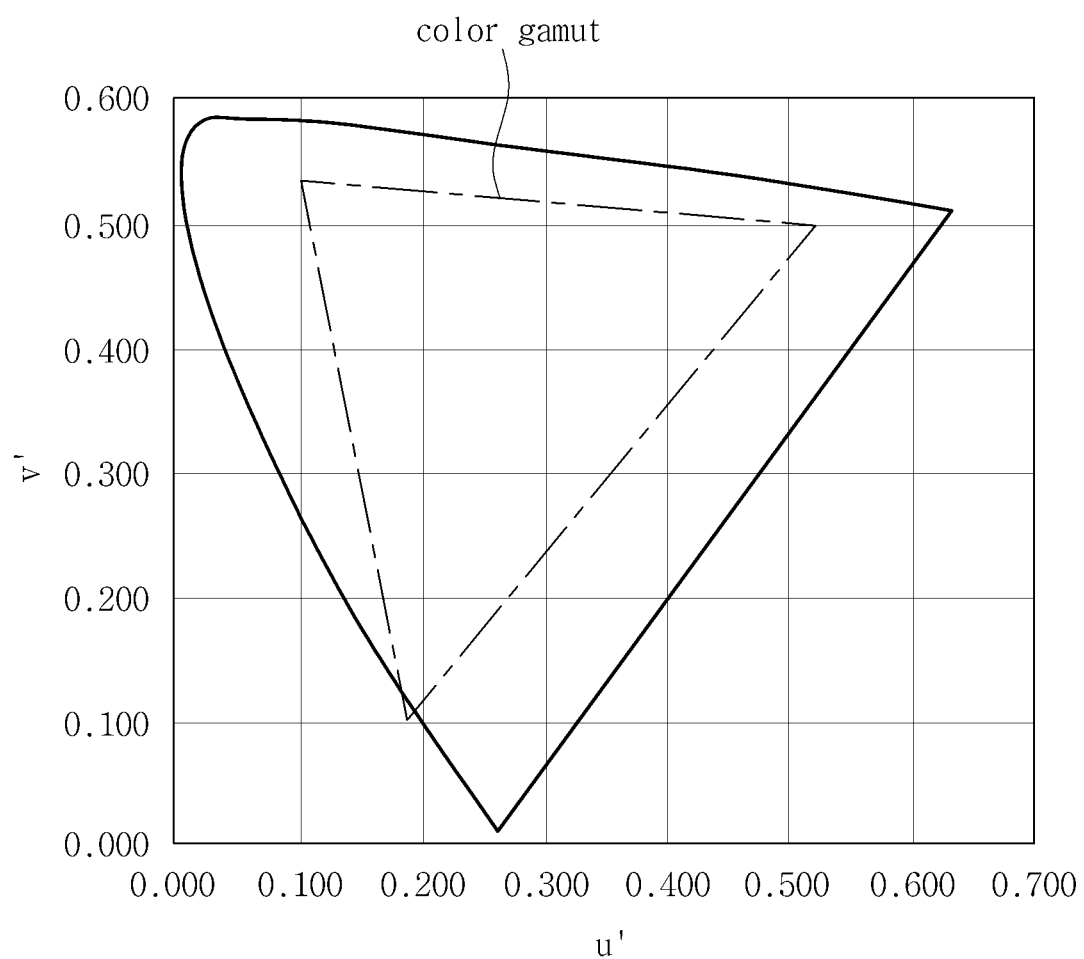
FIG. 2 is a view illustrating the CIE 1976 chromaticity diagram.
Figure 3:
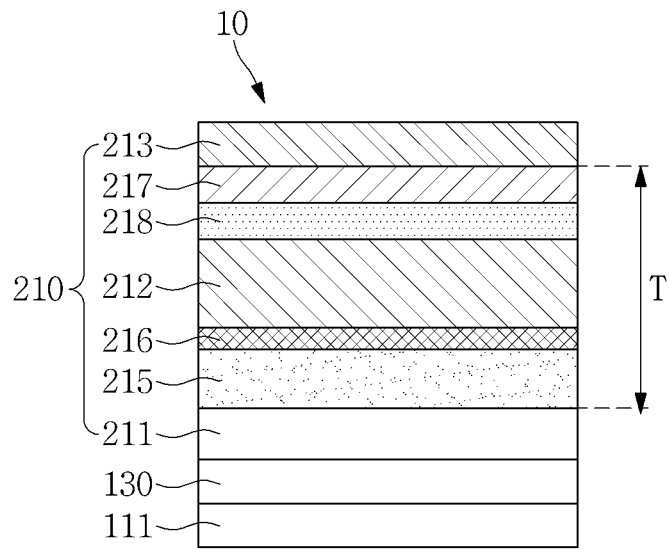
FIG. 3 is a cross-sectional view schematically illustrating a display panel according to an exemplary embodiment.

FIG. 1 is a block diagram illustrating an inspection device for a display panel according to an exemplary embodiment; FIG. 2 is a view illustrating the CIE 1976 chromaticity diagram; and FIG. 3 is a cross-sectional view schematically illustrating a display panel according to an exemplary embodiment.

Referring to FIG. 1, an inspection device 1 for a display panel 10 according to an exemplary embodiment includes a first measurement unit 21, a second measurement unit 22, a color coordinates calculation unit 30, and a determination unit 40.

Each of the first measurement unit 21 and the second measurement unit 22 located apart from a target point P of the display panel 10 by an equal (i.e. equal or substantially equal) distanced measures a light emitted from the display panel 10. In such an exemplary embodiment, the first measurement unit 21 may face the target point P from a front side of the display panel 10 and the second measurement unit 22 may face the target point P from a lateral side of the display panel 10 which is inclined by an angle (e.g., a predetermined angle) with respect to the front side of the display panel 10. For example, the first measurement unit 21 may always be fixed to face the target point P from the front side of the display panel 10, and the second measurement unit 22 may be configured to be movable so as to face the target point P from lateral sides of the display panel 10 at various angles. Accordingly, the first measurement unit 21 and the second measurement unit 22 may measure the light emitted from a same target point P at respective different angles (viewing angles).

The first measurement unit 21 measures the light emitted from the target point P at a first viewing angle which is a front viewing angle, and converts the measurement result into an electrical signal. The second measurement unit 22 measures the light emitted from the target point P at a second viewing angle which is a side viewing angle, and converts the measurement result into an electrical signal. Each of the first measurement unit 21 and the second measurement unit 22 outputs the converted electrical signals to the color coordinates calculation unit 30.

The color coordinates calculation unit 30 calculates first color coordinates at the first viewing angle by using the electrical signal received from the first measurement unit 21. In addition, the color coordinates calculation unit 30 calculates second color coordinates at the second viewing angle by using the electrical signal received from the second measurement unit 22. The first color coordinates and the second color coordinates each represent a white color. The white color may have a color temperature in a range from about 3,000 K to about 35,000 K.

In such an exemplary embodiment, the first color coordinates and the second color coordinates are color coordinates on the CIE 1976 chromaticity diagram of FIG. 2. The u'v' CIE 1976 chromaticity diagram may include concepts such as black body locus (BBL), color temperature and correlated color temperature (CCT). As illustrated in FIG. 2, the display panel 10 may have a specific color gamut in a color space defined by the CIE. The color gamut may be an index indicating how many colors the display panel 10 may express.

The determination unit 40 determines whether a color difference depending on the viewing angle of the display panel 10 is within an appropriate range. For example, there is a preset reference area on the u'v' chromaticity diagram, and the determination unit 40 determines whether a difference value between the first color coordinates at the first viewing angle and the second color coordinates at the second viewing angle is within the reference area. The reference area corresponds to an allowable color difference range of the display panel 10 when the display panel 10 emits a white light. The reference area may be determined according to the intention of a manufacturer of the display panel 10.

When the difference value between the first color coordinates and the second color coordinates is within the reference area, the determination unit 40 may determine that the display panel 10 has fair quality with respect to the viewing angle. On the other hand, when the difference value between the first color coordinates and the second color coordinates is not within the reference area, the determination unit 40 may correct the second color coordinates so that the difference value between the first color coordinates and the second color coordinates is within the reference area, which will be described in further detail below.

Referring to FIG. 3, the display panel 10 according to an exemplary embodiment is an organic light emitting diode ("OLED") display panel including a substrate 111, a wiring portion 130, and an OLED 210.

In an embodiment, the substrate 111 may include an insulating material selected from the group consisting of: glass, quartz, ceramic, plastic, or the like. However, exemplary embodiments are not limited thereto, and the substrate 111 according to another embodiment may include a metallic material, such as stainless steel.

The wiring portion 130 is disposed on the substrate 111. In addition, although not illustrated, a buffer layer may be further disposed between the substrate 111 and the wiring portion 130. The buffer layer (not shown) may include one or more layers selected from various inorganic layers and organic layers. The buffer layer (not shown) serves to prevent or substantially prevent permeation of undesirable elements or moisture into the wiring portion 130 or the OLED 210, and to planarize a surface therebelow.

The wiring portion 130 includes a plurality of thin film transistors ("TFTs") and a plurality of capacitors, and drives the OLED 210 on the wiring portion 130. The OLED 210 emits light according to a driving signal received from the wiring portion 130 to display images.

The OLED 210 includes a first electrode 211, an organic light emitting layer 212 on the first electrode 211, and a second electrode 213 on the organic light emitting layer 212. Holes and electrons are injected into the organic light emitting layer 212 from the first electrode 211 and the second electrode 213, respectively, and combined therein to form an exciton. Light emission occurs when the exciton falls from an excited state to a ground state.

In an exemplary embodiment, the first electrode 211 is an anode for injecting holes, and the second electrode 213 is a cathode for injecting electrons. However, exemplary embodiments are not limited thereto, and the first electrode 211 may be a cathode and the second electrode 213 may be an anode.

According to an exemplary embodiment, the first electrode 211 includes a light transmissive electrode, and the second electrode 213 includes a transflective electrode. In addition, a light generated in the organic light emitting layer 212 passes through the second electrode 213 to be emitted.

For example, the first electrode 211 may include a transparent conductive layer, and the transparent conductive layer may include a transparent conductive oxide (TCO). For example, the TCO may be at least one of: indium tin oxide (ITO), indium zinc oxide (IZO), zinc oxide (ZnO), aluminum zinc oxide (AZO), and indium oxide ($In_2O_3$). In an embodiment, the first electrode 211 may have a structure in which two or more transparent conductive layers are stacked.

In an embodiment, the second electrode 213 may include a transflective layer including one or more metals of magnesium (Mg), silver (Ag), gold (Au), calcium (Ca), lithium (Li), chromium (Cr), aluminum (Al), and copper (Cu). In an embodiment, the transflective layer has a thickness of about 200 nm or less. However, the thickness of the second electrode 213 according to an exemplary embodiment is not limited thereto.

In an embodiment, a hole injection layer (HIL) 215 and a hole transporting layer (HTL) 216 are disposed between the first electrode 211 and the organic light emitting layer 212.

However, exemplary embodiments are not limited thereto, and the OLED 210 may include only one of the hole injection layer 215 and the hole transporting layer 216, or the hole injection layer 215 and the hole transporting layer 216 may be omitted. In an embodiment, a separate light emission auxiliary layer or a resonance auxiliary layer may be further disposed between the first electrode 211 and the organic light emitting layer 212.

In an embodiment, an electron injection layer (EIL) 217 and an electron transporting layer (ETL) 218 are disposed between the organic light emitting layer 212 and the second electrode 213. However, exemplary embodiments are not limited thereto, and the OLED 210 may include only one of the electron injection layer 217 and the electron transporting layer 218, or the electron injection layer 217 and the electron transporting layer 218 may be omitted. In an embodiment, a separate light emission auxiliary layer or a resonance auxiliary layer may be further disposed between the organic light emitting layer 212 and the second electrode 213.

Each of the organic light emitting layer 212, the hole injection layer 215, the hole transporting layer 216, the electron injection layer 217 and the electron transporting layer 218 may be referred to as an organic layer. That is, the OLED 210 has a structure in which the first electrode 211 and the second electrode 213 surround the plurality of organic layers 212, 215, 216, 217, and 218 including an organic material. The plurality of organic layers 212, 215, 216, 217, and 218 may include a low molecular organic material or a high molecular organic material, respectively. In an embodiment, the plurality of organic layers 212, 215, 216, 217, and 218 may be formed through a deposition process at each predetermined pixel area.

In such an exemplary embodiment, depending on a deposition thickness T of the plurality of organic layers 212, 215, 216, 217, and 218, a color difference of the display panel 10 depending on the viewing angle may vary. Accordingly, by adjusting the deposition thickness T of the plurality of organic layers 212, 215, 216, 217, and 218, the color difference of the display panel 10 depending on the viewing angle may be reduced or substantially minimized. For example, a deposition thickness of at least one of the plurality of organic layers 212, 215, 216, 217, and 218 may be adjusted so that a total deposition thickness T of the plurality of organic layers 212, 215, 216, 217, and 218 may be adjusted. According to an exemplary embodiment, the total deposition thickness T of the plurality of organic layers 212, 215, 216, 217, and 218 may be adjusted within a range from about 1 Å to about 100 Å.

As described above, when the difference value between the first color coordinates and the second color coordinates is not within the reference area, the determination unit 40 of the inspection device 1 may correct the second color coordinates so that the difference value between the first color coordinates and the second color coordinates is within the reference area. According to an exemplary embodiment, the second color coordinates at the second viewing angle may be corrected by adjusting the deposition thickness T of the plurality of organic layers 212, 215, 216, 217, and 218. That is, by adjusting the deposition thickness T of the plurality of organic layers 212, 215, 216, 217, and 218, the color difference of the display panel 10 depending on the viewing angle may be reduced or substantially minimized, which will be described in further detail below.

Figure 4A:
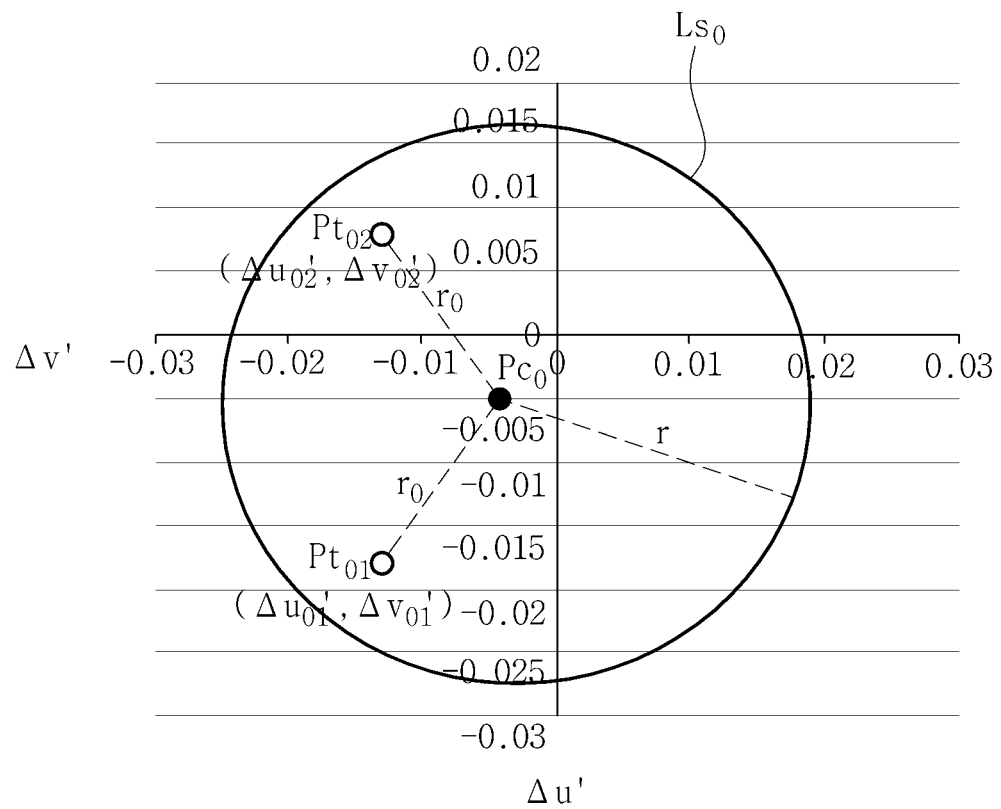
FIGS. 4A and 4B are views respectively illustrating a circular reference area and an irregular reference area on a chromaticity diagram.
Figure 4B:
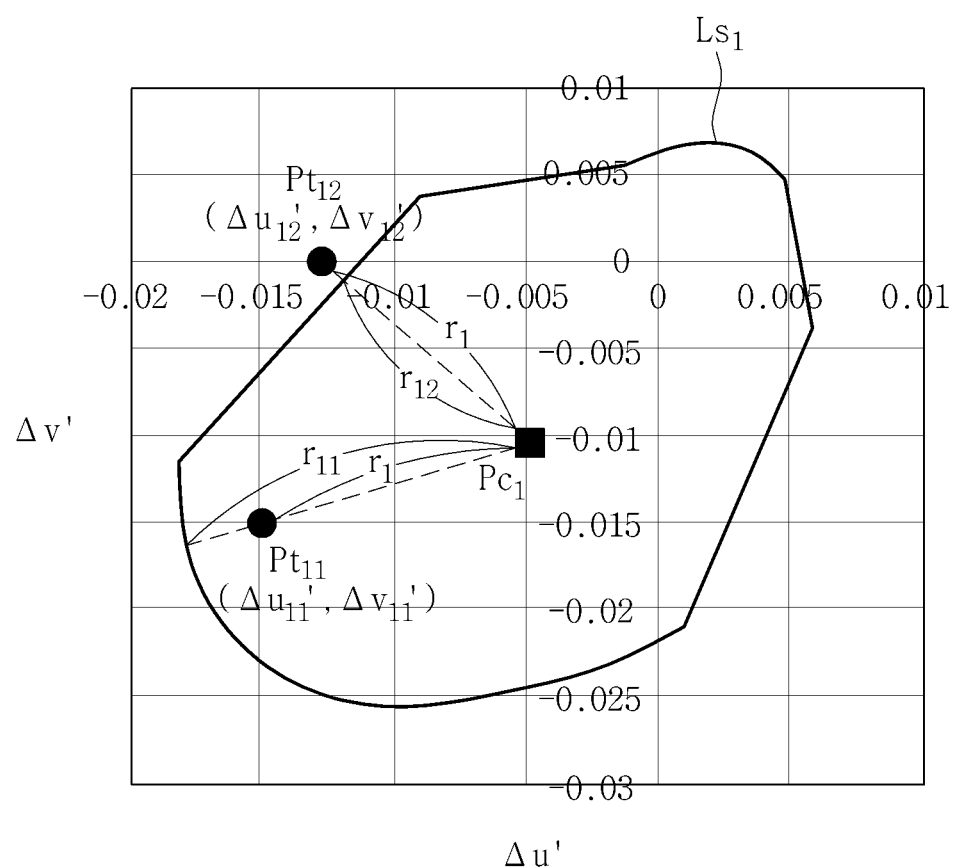

FIGS. 4A and 4B are views respectively illustrating a circular reference area and an irregular reference area on a chromaticity diagram. FIG. 4A is a view illustrating a case in which a reference line defining a reference area is a circular closed curve; and FIG. 4B is a view illustrating a case in which a reference line defining a reference area is a closed curve having an irregular shape.

When a reference line $Ls_0$ defining the reference area is a circular closed curve, a distance r from a center point $Pc_0$ of the reference area to the reference line $Ls_0$ is always constant regardless of the direction. Accordingly, the difference value between the first color coordinates and the second color coordinates measured at any target point of the display panel 10 may be determined whether or not it is in the reference area according to the distance from the center point $Pc_0$ of the reference area regardless of the direction.

For example, as illustrated in FIG. 4A, when a difference value between the first color coordinates and the second color coordinates measured at a first target point which indicates a target measurement position of the display panel 10 is defined as first target color coordinates $Pt_{01}(\Delta u_{01}', \Delta v_{01}')$, a distance $r_0$ from the center point $Pc_0$ of the reference area to the first target color coordinates $Pt_{01}$ may be less than a distance r from the center point $Pc_0$ of the reference area to the reference line $Ls_0$. When the distance $r_0$ from the center point $Pc_0$ of the reference area to the first target color coordinates $Pt_{01}$ is less than the distance r from the center point $Pc_0$ of the reference area to the reference line $Ls_0$ ($r_0 < r$), the determination unit 40 determines that the first target color coordinates $Pt_{01}$ are located within the reference area. On the other hand, although not illustrated, when the distance $r_0$ from the center point $Pc_0$ of the reference area to the first target color coordinates $Pt_{01}$ is greater than the distance r from the center point $Pc_0$ of the reference area to the reference line $Ls_0$, the determination unit 40 determines that the first target color coordinates $Pt_{01}$ are located outside the reference area.

In addition, a difference value between the first color coordinates and the second color coordinates measured at a second target point which indicates another target measurement position of the display panel 10 is defined as second target color coordinates $Pt_{02}(\Delta u_{02}', \Delta v_{02}')$, and a distance $r_0$ from the center point $Pc_0$ of the reference area to the second target color coordinates $Pt_{02}$ may be less than a distance r from the center point $Pc_0$ of the reference area to the reference line $Ls_0$. When the distance $r_0$ from the center point $Pc_0$ of the reference area to the second target color coordinates $Pt_{02}$ is less than the distance r from the center point $Pc_0$ of the reference area to the reference line $Ls_0$ ($r_0 < r$), the determination unit 40 determines that the second target color coordinates $Pt_{02}$ are located within the reference area. On the other hand, although not illustrated, when the distance $r_0$ from the center point $Pc_0$ of the reference area to the second target color coordinates $Pt_{02}$ is greater than the distance r from the center point $Pc_0$ of the reference area to the reference line $Ls_0$, the determination unit 40 determines that the second target color coordinates $Pt_{02}$ are located outside the reference area.

In such an exemplary embodiment as illustrated in FIG. 4A, although the first target color coordinates $Pt_{01}$ and the second target color coordinates $Pt_{02}$ are different from each other in terms of respective coordinate values, the distances $r_0$ from the center point $Pc_0$ of the reference area are the same (i.e. the same or substantially the same) as each other. That is, the first target color coordinates $Pt_{01}$ and the second target color coordinates $Pt_{02}$ are different from each other in terms of direction in which they are located with respect to the center point $Pc_0$ of the reference area on the chromaticity diagram, but the distances $r_0$ from the center point $Pc_0$ of the reference area are substantially the same as each other.

Accordingly, when the reference line $Ls_0$ defining the reference area is a circular closed curve, it may be determined whether each of the first color coordinates $Pt_{01}$ and the second target color coordinates $Pt_{02}$ is located within the reference area according to the distance $r_0$ from the center point $Pc_0$ of the reference area regardless of the location.

On the other hand, when a reference line $Ls_1$ defining a reference area is a closed curve having an irregular shape, a distance from a center point $Pc_1$ of the reference area to the reference line $Ls_1$ is not constant and may have a different value depending on a direction. Accordingly, it may not be determined only by the distance from the center point $Pc_1$ of the reference area whether the difference value between the first color coordinates and the second color coordinates measured at an arbitrary target point of the display panel 10 is within the reference area.

For example, as illustrated in FIG. 4B, when a difference value between the first color coordinates and the second color coordinates measured at a first target point which indicates a target measurement position of the display panel 10 is defined as first target color coordinates $Pt_{11}(\Delta u_{11}', \Delta v_{11}')$, a distance $r_1$ from the center point $Pc_1$ of the reference area to the first target color coordinates $Pt_{11}$ may be less than a distance $r_{11}$ from the center point $Pc_1$ of the reference area to the reference line $Ls_1$ in a same direction ($r_1 < r_{11}$). When the distance $r_1$ from the center point $Pc_1$ of the reference area to the first target color coordinates $Pt_{11}$ is less than the distance $r_{11}$ from the center point $Pc_1$ of the reference area to the reference line $Ls_1$ in a same direction, the determination unit 40 determines that the first target color coordinates $Pt_{11}$ are located within the reference area.

In addition, when a difference value between the first color coordinates and the second color coordinates measured at a second target point which indicates another target measurement position of the display panel 10 is defined as second target color coordinates $Pt_{12}(\Delta u_{12}', \Delta v_{12}')$, a distance $r_1$ from the center point $Pc_1$ of the reference area to the second target color coordinates $Pt_{12}$ may be greater than a distance $r_{12}$ from the center point $Pc_1$ of the reference area to the reference line $Ls_1$ in a same direction ($r_1 < r_{12}$). When the distance $r_1$ from the center point $Pc_1$ of the reference area to the second target color coordinates $Pt_{12}$ is greater than the distance $r_{12}$ from the center point $Pc_1$ of the reference area to the reference line $Ls_1$ in a same direction, the determination unit 40 determines that the second target color coordinates $Pt_{12}$ are located outside the reference area.

In such an exemplary embodiment, as illustrated in FIG. 4B, although the first target color coordinates $Pt_{11}$ and the second target color coordinates $Pt_{12}$ are different from each other in terms of respective coordinate values, the distances $r_1$ from the center point $Pc_1$ of the reference area are the same (i.e. the same or substantially the same) as each other. That is, the first target color coordinates $Pt_{11}$ and the second target color coordinates $Pt_{12}$ are different from each other in terms of direction in which they are located with respect to the center point $Pc_1$ of the reference area on the chromaticity diagram, but the distances $r_1$ from the center point $Pc_1$ of the reference area are the same as each other.

However, when the reference line $Ls_1$ is an irregular closed curve, dissimilar to the case in which the reference line $Ls_0$ is a circular closed curve, whether each of the first and second target color coordinates $Pt_{11}$ and $Pt_{12}$ is within the reference area may not be determined only by the distance $r_1$ from the center point $Pc_1$ of the reference area to the first and second target color coordinates $Pt_{11}$ and $Pt_{12}$.

In other words, when the reference line $Ls_1$ is an irregular closed curve, whether each of the first and second target color coordinates $Pt_{11}$ and $Pt_{12}$ is within the reference area may not be determined only by the distance $r_1$ from the center point $Pc_1$ of the reference area because the distances $r_{11}$ and $r_{12}$ from the center point $Pc_1$ of the reference area to the reference line $Ls_1$ are not constant, depending on a direction. Accordingly, in order to determine whether each of the first and second target color coordinates $Pt_{11}$ and $Pt_{12}$ is within the reference area when the reference line $Ls_1$ is an irregular closed curve, not only the distance $r_1$ from the center point $Pc_1$ to the first and second target color coordinates $Pt_{11}$ and $Pt_{12}$ but also respective locations of the first and second target color coordinates $Pt_{11}$ and $Pt_{12}$ should be considered.

Herein, a method of inspecting a display panel according to an exemplary embodiment will be described in further detail with reference to FIGS. 5 and 6.

Figure 5:
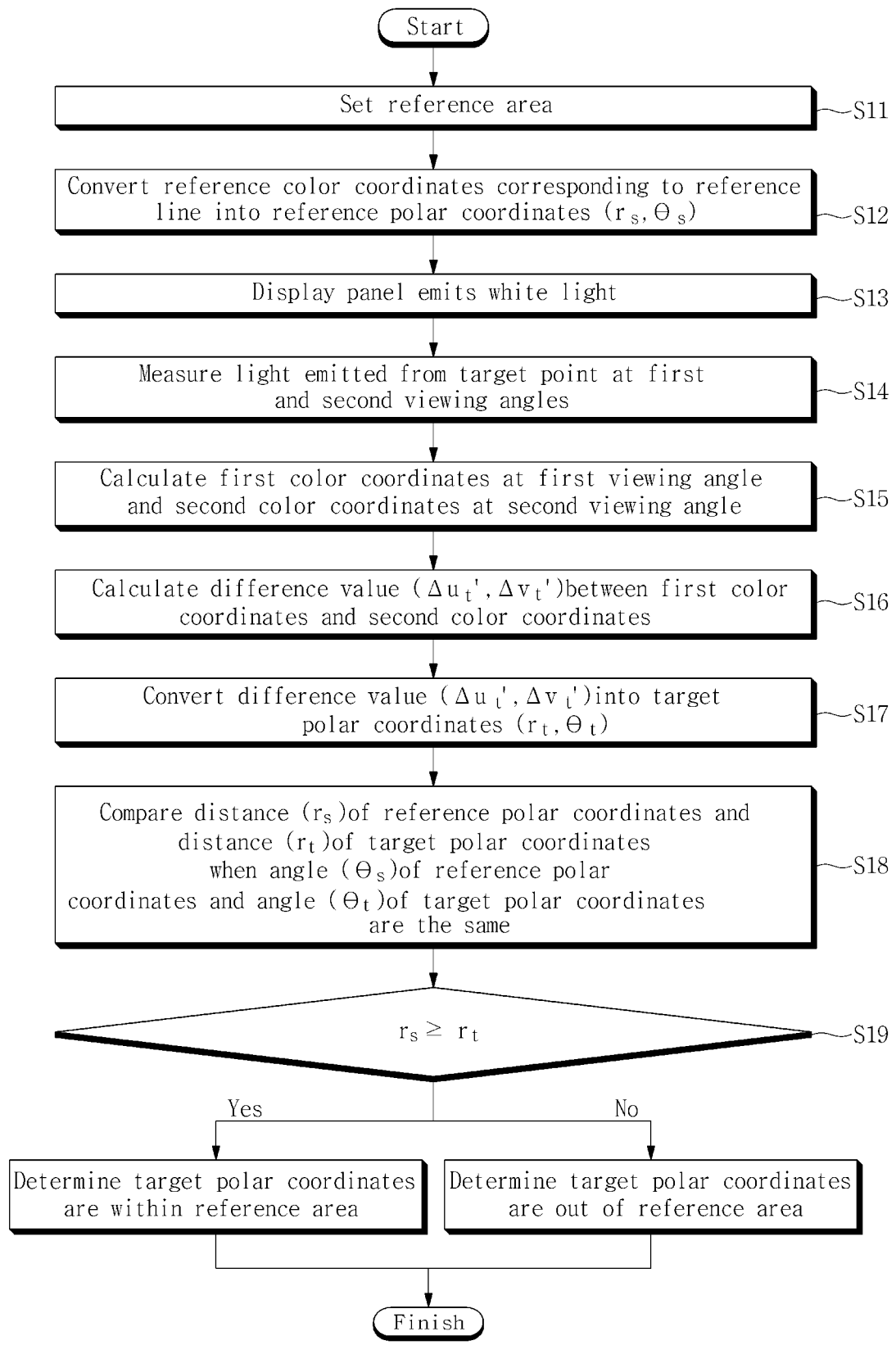
FIG. 5 is a flowchart illustrating a method of inspecting a display panel according to an exemplary embodiment.
Figure 6:
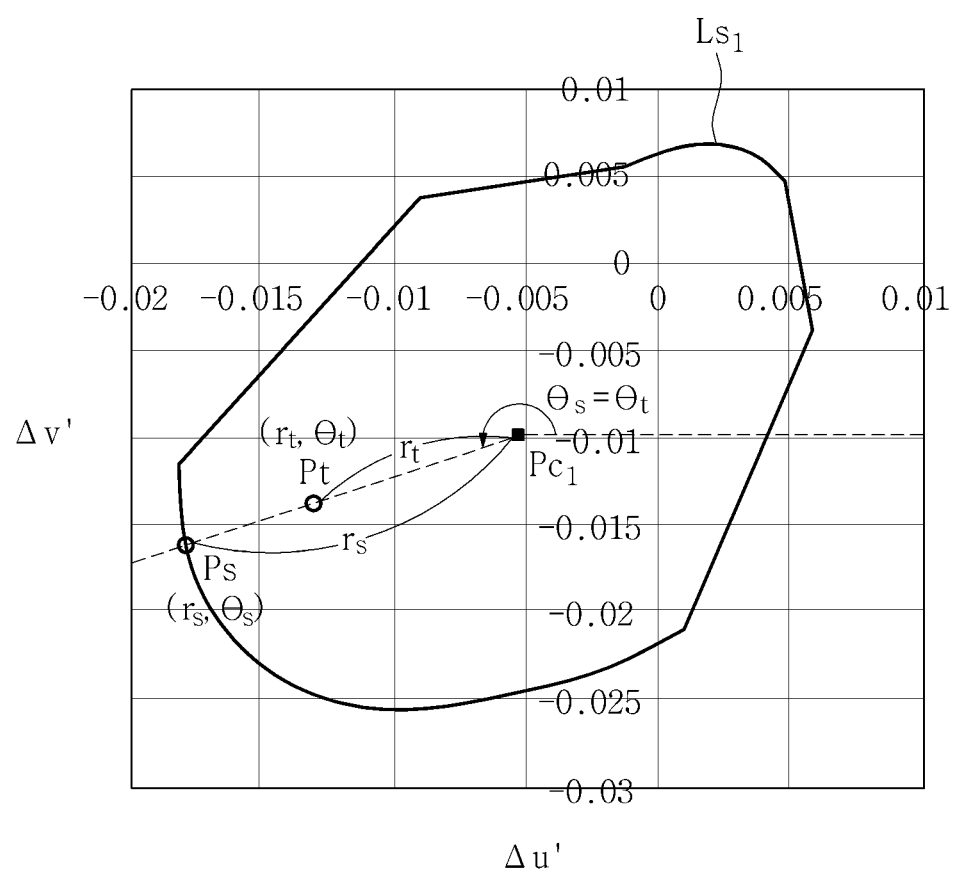
FIG. 6 is a view for explaining the method of inspecting a display panel according to an exemplary embodiment.

FIG. 5 is a flowchart illustrating a method of inspecting a display panel according to an exemplary embodiment; and FIG. 6 is a view for explaining the method of inspecting a display panel according to an exemplary embodiment.

Referring to FIGS. 1, 5, and 6, a reference area having a center point $Pc_1$ is firstly set on a chromaticity diagram (S11). For example, the reference area may be determined according to the intention of the manufacturer of the display panel 10. The reference area is defined by a reference line $Ls_1$. According to an exemplary embodiment, the reference line $Ls_1$ is an irregular closed curve. However, exemplary embodiments are not limited thereto, and the reference line $Ls_1$ may be a closed curve having a regular shape.

Reference color coordinates corresponding to the reference line $Ls_1$ are converted into reference polar coordinates $P_s(r_s, \theta_s)$ (S12). In such an exemplary embodiment, the reference polar coordinates $P_s(r_s, \theta_s)$ are converted with the center point $Pc_1$ of the reference area as an origin. When the reference color coordinates are represented as $P_s(\Delta u_s', \Delta v_s')$, the reference polar coordinates $P_s(r_s, \theta_s)$ may be converted based on the following Equation 1.

$$(r_s, \theta_s) = \left( \sqrt{(\Delta u_s')^2 + (\Delta v_s')^2}, \tan^{-1} \frac{\Delta v_s'}{\Delta u_s'} \right) \quad \text{Equation 1}$$

Subsequently, the display panel 10 emits a white light (S13), and the light emitted from the target point P of the display panel 10 is measured by each of a first measurement unit 21 and a second measurement unit 22 (S14). In such an exemplary embodiment, the first measurement unit 21 measures the light emitted from the target point P at a first viewing angle which is a front viewing angle, and the second measurement unit 22 measures the light emitted from the target point P at a second viewing angle which is a side viewing angle. In an embodiment, when the first viewing angle which is the front viewing angle is about 0 degrees, the second viewing angle may be in a range from about 15 degrees to about 60 degrees.

The color coordinates calculation unit 30 calculates first color coordinates at the first viewing angle and second color coordinates at the second viewing angle by using electrical signals received from the first measurement unit 21 and the second measurement unit 22 (S15).

Then, the determination unit 40 calculates a difference value $(\Delta u_t', \Delta v_t')$ between the first color coordinates and the second color coordinates to determine whether or not the color difference according to the viewing angle of the display panel 10 is within an appropriate range (S16). As described above, the difference value $(\Delta u_t', \Delta v_t')$ between the first color coordinates and the second color coordinates is defined as target color coordinates.

The target color coordinates are converted into target polar coordinates $P_t(r_t, \theta_t)$ (S17). In such an exemplary embodiment, the target polar coordinates $P_t(r_t, \theta_t)$ are converted with the center point $Pc_1$ of the reference area as an origin. When the target color coordinates are represented as $P_t(\Delta u_t', \Delta v_t')$, the target polar coordinates $P_t(r_t, \theta_t)$ may be converted based on the following Equation 2.

$$(r_t, \theta_t) = \left( \sqrt{(\Delta u_t')^2 + (\Delta v_t')^2}, \tan^{-1} \frac{\Delta v_t'}{\Delta u_t'} \right) \quad \text{Equation 2}$$

Subsequently, an angle $\theta_t$ of the target polar coordinates $P_t(r_t, \theta_t)$ is compared with an angle $\theta_s$ of the reference polar coordinates $P_s(r_s, \theta_s)$. In such an exemplary embodiment, when the angle $\theta_t$ of the target polar coordinates $P_t(r_t, \theta_t)$ is equal (i.e. equal or substantially equal) to the angle $\theta_s$ of the reference polar coordinates $P_s(r_s, \theta_s)$, i.e., ($\theta_s=\theta_t$), the determination unit 40 compares sizes between a distance $r_s$ of the reference polar coordinates $P_s(r_s, \theta_s)$ and a distance $r_t$ of the target polar coordinates $P_t(r_t, \theta_t)$ (S18).

When the distance $r_s$ of the reference polar coordinates $P_s(r_s, \theta_s)$ is greater than or equal (i.e. equal or substantially equal) to the distance $r_t$ of the target polar coordinates $P_t(r_t, \theta_t)$, the determination unit 40 determines that the target polar coordinates $P_t(r_t, \theta_t)$ are within the reference area. On the other hand, when the distance $r_s$ of the reference polar coordinates $P_s(r_s, \theta_s)$ is less than the distance $r_t$ of the target polar coordinates $P_t(r_t, \theta_t)$, the determination unit 40 determines that the target polar coordinates $P_t(r_t, \theta_t)$ are outside the reference area (S19).

The method of inspecting the display panel 10 according to an exemplary embodiment may easily determine whether the target polar coordinates $P_t(r_t, \theta_t)$ are within the irregular reference area by converting the reference color coordinates $P_s(\Delta u_s', \Delta v_s')$ and the target color coordinates $P_t(\Delta u_t', \Delta v_t')$ respectively into the reference polar coordinates $P_s(r_s, \theta_s)$ and the target polar coordinates $P_t(r_t, \theta_t)$ and by comparing sizes between the reference polar coordinates $P_s(r_s, \theta_s)$ and the target polar coordinates $P_t(r_t, \theta_t)$ which are located in a same direction with respect to the center point $Pc_1$.

Herein, a method of inspecting a display panel according to another exemplary embodiment will be described in further detail with reference to FIGS. 7, 8, and 9. The descriptions of the configuration identical to those according to an exemplary embodiment will be omitted for ease of description.

Figure 7:
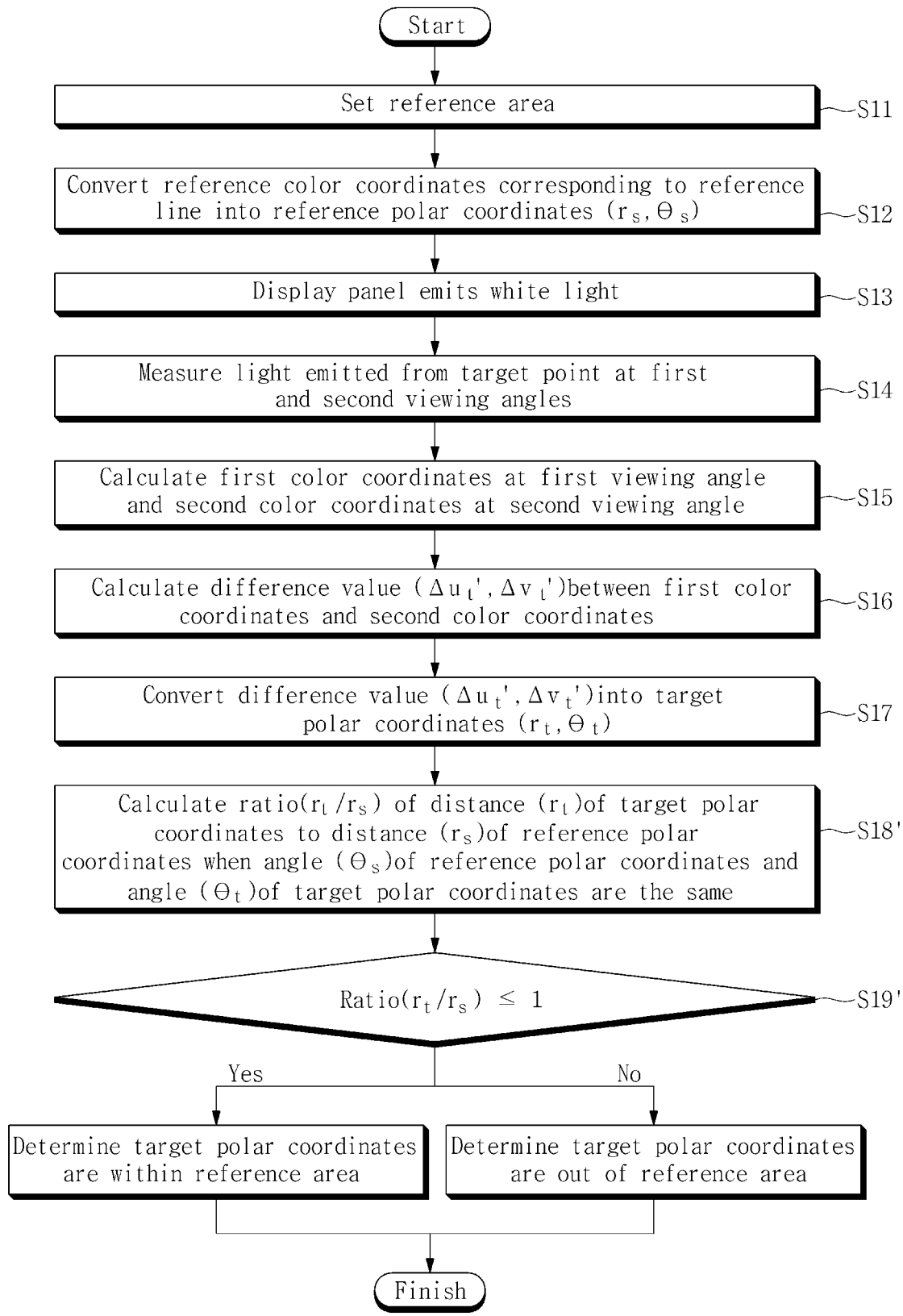
FIG. 7 is a flowchart illustrating a method of inspecting a display panel according to another exemplary embodiment.
Figure 8:
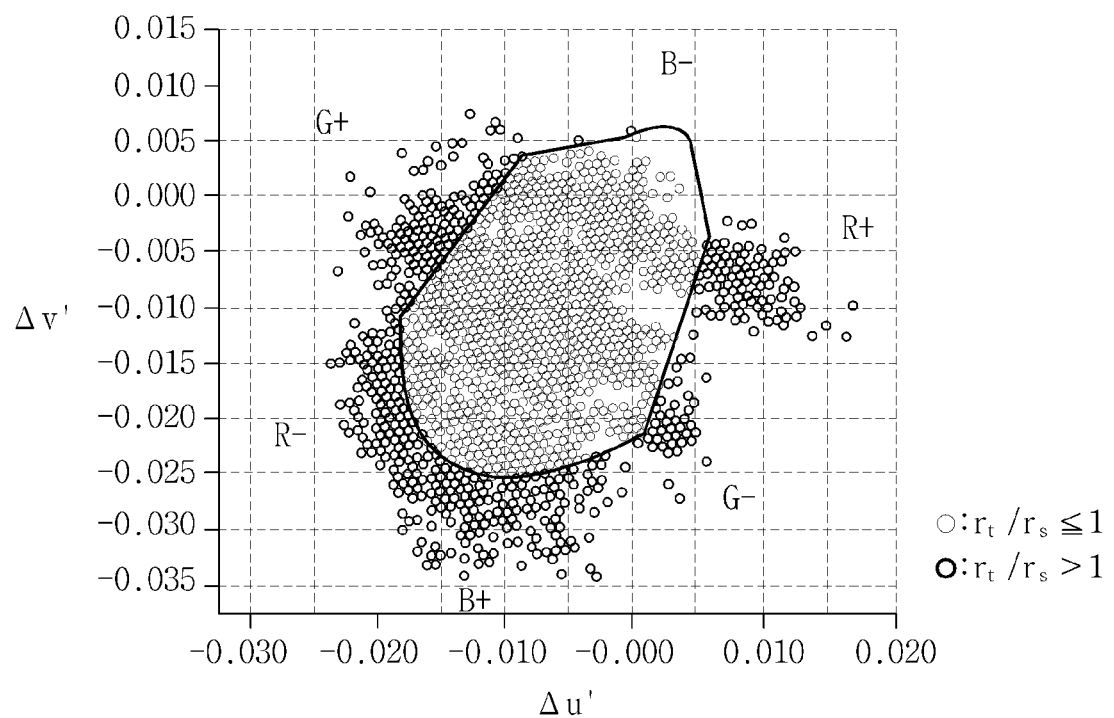
FIGS. 8 and 9 are views for explaining the method of inspecting a display panel according to another exemplary embodiment.
Figure 9:
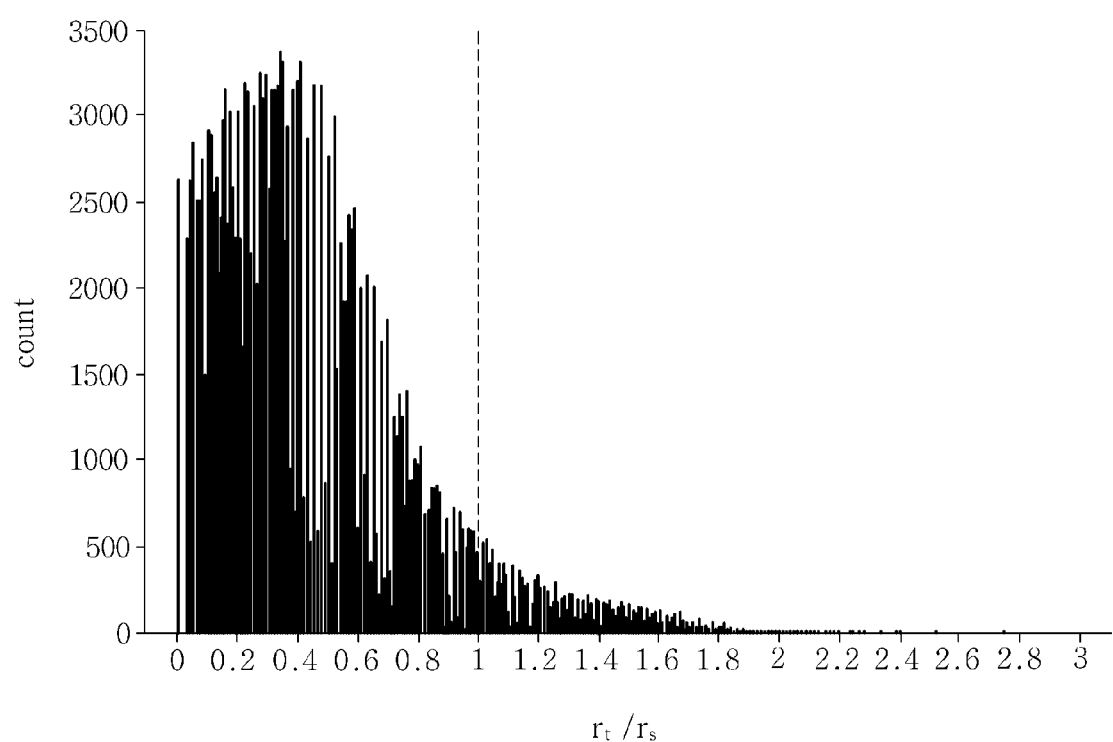

FIG. 7 is a flowchart illustrating a method of inspecting a display panel according to another exemplary embodiment; and FIGS. 8 and 9 are views for explaining the method of inspecting a display panel according to another exemplary embodiment.

Referring to FIG. 7, a method of inspecting the display panel 10 according to another exemplary embodiment is substantially the same as that according to the previously described exemplary embodiment from S11 to S17.

Subsequent to S17, an angle $\theta_t$ of target polar coordinates $P_t(r_t, \theta_t)$ is compared with an angle $\theta_s$ of reference polar coordinates $P_s(r_s, \theta_s)$. In such an exemplary embodiment, when the angle $\theta_t$ of the target polar coordinates $P_t(r_t, \theta_t)$ is equal (i.e. equal or substantially equal) to the angle $\theta_s$ of the reference polar coordinates $P_s(r_s, \theta_s)$, i.e., ($\theta_s=\theta_t$), the determination unit 40 calculates a ratio $r_t/r_s$ of a distance $r_t$ of the target polar coordinates $P_t(r_t, \theta_t)$ to a distance $r_s$ of the reference polar coordinates $P_s(r_s, \theta_s)$ (S18').

When the calculated ratio $r_t/r_s$ is about 1 or less, the determination unit 40 determines that the target polar coordinates $P_t(r_t, \theta_t)$ are within a reference area. On the other hand, when the calculated ratio $r_t/r_s$ is more than 1, the determination unit 40 determines that the target polar coordinates $P_t(r_t, \theta_t)$ are outside the reference area (S19').

The method of inspecting the display panel 10 according to an exemplary embodiment may easily determine whether the target polar coordinates $P_t(r_t, \theta_t)$ are within the irregular reference area by converting the reference color coordinates $P_s(\Delta u_s', \Delta v_s')$ and the target color coordinates $P_t(\Delta u_t', \Delta v_t')$ respectively into the reference polar coordinates $P_s(r_s, \theta_s)$ and the target polar coordinates $P_t(r_t, \theta_t)$ and by calculating the distance ratio $r_t/r_s$ of the target polar coordinates $P_t(r_t, \theta_t)$ to the reference polar coordinates $P_s(r_s, \theta_s)$ which are located in a same direction with respect to the center point $Pc_1$.

Such an inspection process may be repeatedly performed while changing the target point of the display panel 10. Accordingly, as illustrated in FIG. 8, it may be determined whether each difference value between the first color coordinates and the second color coordinates measured at a plurality of target points is within the reference area. That is, by calculating each distance ratio $r_t/r_s$ between the reference polar coordinates Ps and the target polar coordinates Pt located in a same direction with respect to the center point $Pc_1$, it may be determined whether each of the target polar coordinates Pt at the plurality of target points is within the reference area.

In addition, as the inspection process is repeatedly performed while changing the target point, it may be identified that to which area the plurality of target polar coordinates Pt located outside the reference area are concentrated and distributed.

As described above, the OLED 210 according to an exemplary embodiment includes a plurality of organic layers 212, 215, 216, 217, and 218. In addition, the OLED 210 may be any one of a red OLED including a red organic light emitting layer, a green OLED including a green organic light emitting layer, and a blue OLED including a blue organic light emitting layer. By identifying to which area the plurality of target polar coordinates Pt located outside the reference area are concentrated and distributed, a deposition thickness T of the plurality of organic layers included in at least one of the red, green, and blue OLEDs 210 may be adjusted. By adjusting the deposition thickness T of the plurality of organic layers, the color difference of the display panel 10 depending on the viewing angle may be reduced or substantially minimized. According to another exemplary embodiment, the total deposition thickness T of the plurality of organic layers may be adjusted within a range from about 1 Å to about 100 Å

For example, as illustrated in FIG. 8, when the plurality of target polar coordinates Pt are concentrated and distributed at an upper left side outside the reference area, a white color of the display panel 10 may appear greenish at the second viewing angle which is the side viewing angle. Accordingly, when the plurality of target polar coordinates Pt are concentrated at the upper left side outside the reference area, a thickness of the green organic light emitting layer may be reduced such that the color difference of the display panel 10 depending on the viewing angle may be reduced or substantially minimized.

In addition, for example, when the plurality of target polar coordinates Pt are concentrated and distributed at a lower side outside the reference area, the white color of the display panel 10 may appear bluish at the second viewing angle which is the side viewing angle. Accordingly, when the plurality of target polar coordinates Pt are concentrated and distributed at the lower side outside the reference area, a thickness of the blue organic light emitting layer may be reduced such that the color difference of the display panel 10 depending on the viewing angle may be reduced or substantially minimized.

In addition, the inspection process may be repeatedly performed while changing the target point of the display panel 10 so as to calculate respective distance ratios $r_t/r_s$ for the plurality of target points, which may be normalized as in FIG. 9 by counting the number of repetition according to the calculated distance ratio $r_t/r_s$.

As set forth herein, according to one or more exemplary embodiments, a method of inspecting a display panel in order to reduce or substantially minimize a color difference of a display panel according to a viewing angle may, in particular, easily determine whether target polar coordinates are located within a regular or irregular reference area.

While the present invention has been illustrated and described with reference to some exemplary embodiments thereof, it will be apparent to those of ordinary skill in the art that various changes in form and detail may be made thereto without departing from the spirit and scope of the present invention.

What is claimed is:

1. A method of inspecting a display panel, the method comprising:
    setting a reference area having a center point on a chromaticity diagram;
    emitting a white light on the display panel;
    measuring first color coordinates of a target point of the display panel at a first viewing angle;
    measuring second color coordinates of the target point at a second viewing angle;
    calculating a difference value between the first color coordinates and the second color coordinates;
    converting the difference value into target polar coordinates with the center point as an origin; and
    determining whether the target polar coordinates are within the reference area,
    wherein setting of the reference area comprises:
    setting reference color coordinates of a reference line defining the reference area; and
    converting the reference color coordinates into reference polar coordinates with the center point as an origin, and
    wherein determining whether the target polar coordinates are within the reference area comprises:
    comparing an angle of the target polar coordinates with an angle of the reference polar coordinates; and
    comparing sizes between a first distance from the center point to the reference polar coordinates and a second distance from the center point to the target polar coordinates when the angle of the target polar coordinates is equal to the angle of the reference polar coordinates.

2. The method of claim 1, wherein it is determined that the target polar coordinates are within the reference area when the first distance is greater than or equal to the second distance.

3. The method of claim 1, wherein it is determined that the target polar coordinates are outside the reference area when the first distance is less than the second distance.

4. The method of claim 1, wherein the display panel comprises:
    a first electrode on a substrate;
    a plurality of organic layers on the first electrode; and
    a second electrode on the plurality of organic layers.

5. The method of claim 4, further comprising adjusting a thickness of at least one of the plurality of organic layers when the first distance is less than the second distance.

6. The method of claim 5, wherein a total thickness of the plurality of organic layers is adjusted in a range from about 1 Å to about 100 Å.

7. The method of claim 4, wherein the plurality of organic layers comprises at least one of a red organic light emitting layer, a green organic light emitting layer, and a blue organic light emitting layer.

8. The method of claim 7, wherein the plurality of organic layers further comprises at least one of a hole injection layer, a hole transport layer, an electron injection layer, an electron transport layer, a light emission auxiliary layer, and a resonance auxiliary layer.

9. The method of claim 1, wherein the reference line is a closed curve having a circular shape or an irregular shape.

10. The method of claim 1, wherein the first viewing angle is a front viewing angle of the display panel.

11. The method of claim 10, wherein when the front viewing angle of the display panel is about 0 degrees, the second viewing angle is in a range from about 15 degrees to about 60 degrees.

12. A method of inspecting a display panel, the method comprising:
    setting a reference area having a center point on a chromaticity diagram;
    emitting a white light on the display panel;
    measuring first color coordinates of a target point of the display panel at a first viewing angle;
    measuring second color coordinates of the target point at a second viewing angle;
    calculating a difference value between the first color coordinates and the second color coordinates;
    converting the difference value into target polar coordinates with the center point as an origin; and
    determining whether the target polar coordinates are within the reference area,
    wherein setting of the reference area comprises:
    setting reference color coordinates of a reference line defining the reference area; and
    converting the reference color coordinates into reference polar coordinates with the center point as an origin, and
    wherein determining whether the target polar coordinates are within the reference area comprises:
    comparing an angle of the target polar coordinates with an angle of the reference polar coordinates; and
    calculating a ratio between a first distance from the center point to the reference polar coordinates and a second distance from the center point to the target polar coordinates when the angle of the target polar coordinates is equal to the angle of the reference polar coordinates.

13. The method of claim 12, wherein it is determined that the target polar coordinates are within the reference area when a ratio of the second distance to the first distance is equal to or less than 1.

14. The method of claim 12, wherein it is determined that the target polar coordinates are outside the reference area when the ratio of the second distance to the first distance is greater than 1.

15. The method of claim 12, wherein the display panel comprises:
   a first electrode on a substrate;
   a plurality of organic layers on the first electrode; and
   a second electrode on the plurality of organic layers.

16. The method of claim 15, further comprising adjusting a thickness of at least one of the plurality of organic layers when the ratio of the second distance to the first distance is greater than 1.

17. The method of claim 15, wherein a total thickness of the plurality of organic layers is adjusted in a range from about 1 Å to about 100 Å.

18. The method of claim 15, wherein the plurality of organic layers comprises at least one of a red organic light emitting layer, a green organic light emitting layer, and a blue organic light emitting layer.

\* \* \* \* \*